United States Patent
Raviprakash et al.

(10) Patent No.: US 10,862,521 B1
(45) Date of Patent: Dec. 8, 2020

(54) TECHNIQUES FOR PROGRAMMABLE GAIN ATTENUATION IN WIDEBAND MATCHING NETWORKS WITH ENHANCED BANDWIDTH

(71) Applicant: INPHI CORPORATION, Santa Clara, CA (US)

(72) Inventors: Karthik Raviprakash, Santa Clara, CA (US); Halil Cirit, San Francisco, CA (US)

(73) Assignee: INPHI CORPORATION, San Jose, CA (US)

( * ) Notice: Subject to any disclaimer, the term of this patent is extended or adjusted under 35 U.S.C. 154(b) by 0 days.

(21) Appl. No.: 16/262,387

(22) Filed: Jan. 30, 2019

(51) Int. Cl.
*H04B 1/16* (2006.01)
*H03G 3/30* (2006.01)
*H03H 11/28* (2006.01)

(52) U.S. Cl.
CPC ............. *H04B 1/16* (2013.01); *H03G 3/3036* (2013.01); *H03H 11/28* (2013.01); *H03G 2201/106* (2013.01)

(58) Field of Classification Search
CPC ........ H04B 1/16; H03H 11/28; H03G 3/3036; H03G 2201/106
See application file for complete search history.

(56) References Cited

U.S. PATENT DOCUMENTS

| | | | | |
|---|---|---|---|---|
| 2,854,191 A * | 9/1958 | Raisbeck | ............. | G06G 7/1928 708/818 |
| 3,083,361 A * | 3/1963 | Schwab | .................... | G01S 7/40 342/165 |
| 3,267,264 A * | 8/1966 | Burk | ........................ | H03M 1/00 702/23 |
| 4,757,395 A * | 7/1988 | Nishikawa | ............. | G11B 5/035 360/46 |
| 4,771,449 A * | 9/1988 | Kiko | ........................ | H04B 3/04 379/402 |
| 4,947,483 A * | 8/1990 | Dirr | .......................... | H04B 3/38 370/282 |
| 5,353,409 A * | 10/1994 | Asprey | .................. | G06F 3/0227 375/257 |
| 5,448,207 A * | 9/1995 | Kohama | .............. | H03H 11/245 333/81 R |
| 5,563,557 A * | 10/1996 | Sasaki | ................... | H03H 11/245 327/328 |
| 6,025,709 A * | 2/2000 | Bradley | .................. | G01R 27/28 307/125 |
| 6,567,472 B1 * | 5/2003 | Poulis | ................. | H04L 25/0278 330/260 |
| 6,628,779 B1 * | 9/2003 | Pietrowicz | ............... | H04B 3/23 379/404 |

(Continued)

FOREIGN PATENT DOCUMENTS

WO    WO-2019078994 A1 *    4/2019    ......... H01L 27/0255

*Primary Examiner* — Berhanu Tadese
(74) *Attorney, Agent, or Firm* — Richard T. Ogawa; Ogawa P.C.

(57) ABSTRACT

The present invention is directed to communication systems and electrical circuits. More specifically, an embodiment of the present invention provides a termination circuit that includes a programmable gain attenuation section, a T-coil section, and a termination resistor. The characteristic resistance of the programmable gain attenuation section matches the resistance of the termination resistor. There are other embodiments as well.

15 Claims, 12 Drawing Sheets

(56) References Cited

U.S. PATENT DOCUMENTS

| | | | | |
|---|---|---|---|---|
| 7,463,112 B1* | 12/2008 | Groves | ............... | H03H 7/38 333/33 |
| 8,520,348 B2* | 8/2013 | Dong | ............... | G06F 13/4086 361/56 |
| 8,687,451 B2* | 4/2014 | Wang | ............... | G11C 11/4072 365/189.05 |
| 8,730,978 B2* | 5/2014 | Sala | ............... | G06F 13/385 370/401 |
| 8,879,348 B2* | 11/2014 | Wang | ............... | G11C 11/4072 365/189.05 |
| 8,989,254 B2* | 3/2015 | Jing | ............... | G06F 13/102 375/233 |
| 9,166,641 B1* | 10/2015 | Li | ............... | H04L 25/03019 |
| 9,502,168 B1* | 11/2016 | Ler | ............... | H01F 17/0013 |
| 9,621,136 B1* | 4/2017 | Chang | ............... | H03K 3/356139 |
| 10,014,965 B1* | 7/2018 | Forey | ............... | H04B 17/21 |
| 10,096,964 B1* | 10/2018 | Abdelhalim | ............... | H01S 3/09 |
| 10,171,158 B1* | 1/2019 | Barzegar | ............... | H04B 3/36 |
| 10,200,106 B1* | 2/2019 | Barzegar | ............... | H04B 1/40 |
| 10,243,570 B1* | 3/2019 | Forey | ............... | H03L 7/0807 |
| 10,269,735 B1* | 4/2019 | Shukla | ............... | H03H 11/28 |
| 10,270,409 B1* | 4/2019 | Forey | ............... | H03G 7/06 |
| 10,284,394 B1* | 5/2019 | Forey | ............... | H04L 25/03878 |
| 10,326,495 B1* | 6/2019 | Barzegar | ............... | H04B 3/54 |
| 10,340,979 B1* | 7/2019 | Barzegar | ............... | H04B 3/58 |
| 10,425,098 B2* | 9/2019 | Liu | ............... | G05D 3/1436 |
| 10,516,469 B2* | 12/2019 | Barzegar | ............... | H04B 3/36 |
| 10,536,212 B2* | 1/2020 | Barzegar | ............... | H04B 7/15 |
| 2002/0031113 A1* | 3/2002 | Dodds | ............... | H04L 25/4908 370/352 |
| 2003/0184384 A1* | 10/2003 | Orr | ............... | H03F 1/565 330/286 |
| 2003/0210110 A1* | 11/2003 | Perreault | ............... | H03H 7/0115 333/177 |
| 2005/0168279 A1* | 8/2005 | Behzad | ............... | H03G 3/001 330/51 |
| 2005/0281564 A1* | 12/2005 | Zitzmann | ............... | H04B 10/6931 398/202 |
| 2006/0151851 A1* | 7/2006 | Pillai | ............... | H01L 24/48 257/531 |
| 2006/0178846 A1* | 8/2006 | Pollock | ............... | G01R 1/06766 702/57 |
| 2007/0024369 A1* | 2/2007 | Cao | ............... | H01L 51/0095 330/269 |
| 2008/0001671 A1* | 1/2008 | Cao | ............... | H03F 1/565 330/286 |
| 2008/0123771 A1* | 5/2008 | Cranford | ............ | H04L 25/0278 375/285 |
| 2009/0039916 A1* | 2/2009 | Buchmann | ........... | G11C 7/1057 326/38 |
| 2010/0024202 A1* | 2/2010 | Maki | ............... | H01F 41/046 29/607 |
| 2011/0049672 A1* | 3/2011 | Okushima | ........... | H01L 23/5227 257/531 |
| 2011/0113401 A1* | 5/2011 | Kireev | ............... | G06F 30/392 716/136 |
| 2011/0121904 A1* | 5/2011 | Kojima | ............ | G01R 19/16576 330/284 |
| 2011/0133729 A1* | 6/2011 | Vernickel | ............... | A61B 5/0522 324/222 |
| 2011/0248811 A1* | 10/2011 | Kireev | ............... | H01L 23/5227 336/200 |
| 2012/0275074 A1* | 11/2012 | Dill | ............... | H02H 9/046 361/56 |
| 2013/0009724 A1* | 1/2013 | Xu | ............... | H03H 11/30 333/32 |
| 2013/0028039 A1* | 1/2013 | Wang | ............... | G11C 11/4072 365/226 |
| 2013/0064326 A1* | 3/2013 | Chen | ............... | H04L 25/0276 375/316 |
| 2014/0160874 A1* | 6/2014 | Wang | ............... | G11C 11/4072 365/226 |
| 2014/0368272 A1* | 12/2014 | Wang | ............... | H03F 3/45071 330/260 |
| 2015/0222236 A1* | 8/2015 | Takemoto | ............ | H04L 25/493 250/214 A |
| 2016/0285314 A1* | 9/2016 | Van Neste | ............... | H02J 50/12 |
| 2017/0187399 A1* | 6/2017 | Hunter | ............... | H03K 17/6872 |
| 2017/0257074 A1* | 9/2017 | Yeh | ............... | H01P 5/185 |
| 2017/0353337 A1* | 12/2017 | Chakraborty | ........ | H04B 1/1027 |
| 2018/0227014 A1* | 8/2018 | Fertner | ............... | H04B 3/46 |
| 2018/0234059 A1* | 8/2018 | Rao | ............... | H03G 1/0088 |
| 2018/0323798 A1* | 11/2018 | Liu | ............... | H03M 1/70 |
| 2018/0366898 A1* | 12/2018 | Abdelhalim | ............... | H01S 3/09 |
| 2019/0058623 A1* | 2/2019 | Shulman | ............... | H04L 27/364 |
| 2019/0074129 A1* | 3/2019 | Fan | ............... | H02H 9/046 |
| 2019/0074686 A1* | 3/2019 | Fan | ............... | H01F 27/2804 |
| 2019/0074687 A1* | 3/2019 | Fan | ............... | H01L 27/0288 |
| 2019/0089150 A1* | 3/2019 | Gharibdoust | ....... | H01F 27/2804 |
| 2019/0123551 A1* | 4/2019 | Yuan | ............... | H04L 25/03031 |
| 2019/0207576 A1* | 7/2019 | Forey | ............... | H03G 1/0029 |
| 2019/0253284 A1* | 8/2019 | Jalali Far | ............... | H03H 7/38 |
| 2019/0296430 A1* | 9/2019 | Bennett | ............... | H01P 3/06 |

* cited by examiner

TECHNIQUES FOR PROGRAMMABLE GAIN ATTENUATION IN WIDEBAND MATCHING NETWORKS WITH ENHANCED BANDWIDTH

CROSS-REFERENCES TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to communication systems and electrical circuits.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily.

In high speed communication applications, an important aspect is to process received signals at the receivers. Among other components, input terminals of receivers are specifically configured to receive and process incoming signals. Over the past, various types of conventional input termination circuits have been used, but they have been inadequate. Therefore, improved systems and methods thereof are desired.

BRIEF SUMMARY OF THE INVENTION

The present invention is directed to communication systems and electrical circuits. More specifically, an embodiment of the present invention provides a termination circuit that includes a programmable gain attenuation section, a T-coil section, and a termination resistor. The characteristic resistance of the programmable gain attenuation section matches the resistance of the termination resistor. There are other embodiments as well.

According to an embodiment, the present invention provides a termination circuit that includes an input terminal for receiving data signals. The termination circuit also has a programmable gain attenuation (PGA) section coupled to the input terminal. The PGA section includes a first resistor, a second resistor, and a third resistor. The first resistor and the third resistor are directly coupled. The PGA section is characterized by a PGA characteristic resistance. The PGA characteristic resistance is adjustable. The termination circuit also includes a T-coil section that has a first inductor and a second inductor. The T-coil section is coupled to the PGA section. The termination circuit also includes a termination resistor coupled to the T-coil section. The termination resistor is characterized by a termination resistance value, which is matched by the PGA characteristic resistance (the PGA characteristic resistance can be adjustable to match the termination resistance). The termination circuit additionally has an output terminal coupled to the second inductor.

According to another embodiment, the present invention provides a termination circuit that has an input terminal for receiving data signals. The termination circuit has two T-coil sections, which include a first T-coil section coupled to the input terminal. The circuit additionally has a programmable gain attenuation (PGA) section coupled to the first T-coil section. The PGA section has a first resistor, a second resistor, and a third resistor. The first resistor and the third resistor are directly coupled. The PGA section is characterized by a PGA characteristic resistance, which is adjustable. The first resistor comprises a variable resistor. The termination circuit also has a second T-coil section that includes a first inductor and a second inductor. The second T-coil section is coupled to the PGA section. The termination circuit additionally includes a termination resistor coupled to the second T-coil section. The termination resistor is characterized by a termination resistance value substantially equal to the PGA characteristic resistance.

According to yet another embodiment, the present invention provides a receiver device that has an input terminal for receiving data signal. The receiver device also includes a termination circuit coupled to the input terminal. The receiver device additionally includes a continuous time linear equalizer (CTLE) coupled to the termination section. The termination circuit comprises a programmable gain attenuation (PGA) section coupled to the input terminal. The PGA section has a first resistor, a second resistor, and a third resistor. The first resistor comprises a variable resistor. The termination circuit also has a T-coil section that has a first inductor and a second inductor, the T-coil section being coupled to the PGA section.

It is to be appreciated that embodiments of the present invention provide many advantages over conventional techniques. Among other things, by employing a PGA section and T-coils, a termination circuit according to embodiments of the present invention have both extended bandwidth and attenuation adjustability ability. More specifically, T-coils as implemented in termination circuits can significantly improve signal bandwidth. For example, T-coil theoretically provides matching until infinite frequency and significantly improve signal bandwidth. PGA provides attenuation and maintains the matching provided by the termination network without affecting bandwidth and matching functionalities of T-coils. For example, the PGA section and a termination resistor effectively matches resistance of a signal source, and the matching resistance effectively reduces signal reflection (e.g., as measured by the S11 parameter). As implemented according to embodiments of the present invention, PGA sections do not negatively impact the performance and functionality of T-coils.

Embodiments of the present invention can be implemented in conjunction with existing systems and processes. For example, termination circuits according to the present invention can be manufactured using existing manufacturing techniques and processes. In various embodiments, termination circuits according to the present invention are characterized by both small circuit area and low power consumption. Additionally, termination circuits according to the present invention can be incorporated into existing systems and devices. For example, termination circuits can be incorporated into data communication modules, receiver devices, serializer/deserializer (SerDes) devices, and others. In certain embodiments, termination circuits are implemented as components of analog front end (AFE) sections of receiver devices. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention is directed to communication systems and electrical circuits. More specifically, an embodiment of the present invention provides a termination circuit that includes a programmable gain attenuation section, a T-coil section, and a termination resistor. The characteristic resistance of the programmable gain attenuation section matches the resistance of the termination resistor. There are other embodiments as well.

Figure 1:
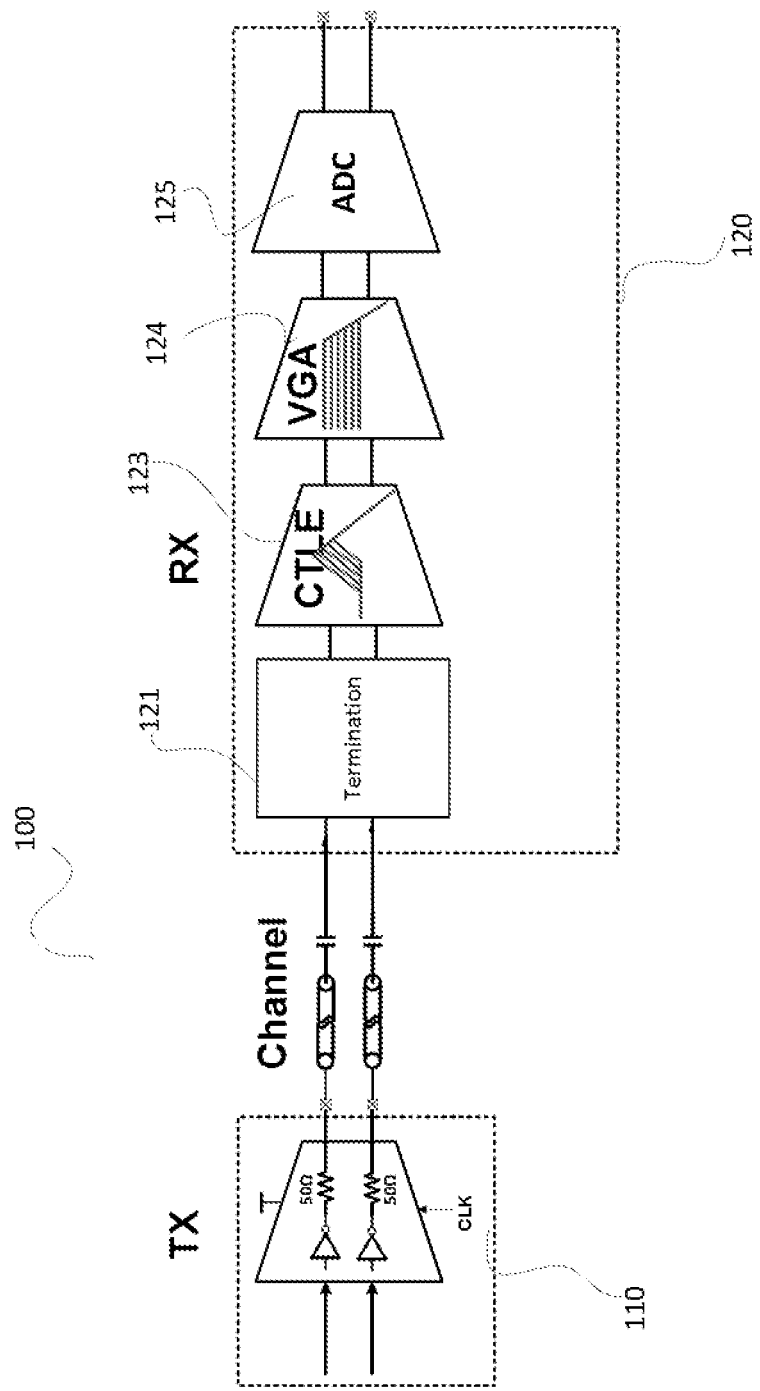
FIG. 1 is a simplified diagram illustrating a communication system according to embodiments of the present invention.

As mentioned above, input termination circuits are an important aspect of receiver implementation. FIG. 1 is a simplified diagram illustrating a communication system according to embodiments of the present invention. This diagram is merely an example, which should not unduly limit the scope of the claims. One of ordinary skill in the art would recognize many variations, alternatives, and modifications. For example, input termination block 121 is implemented as a part of receiver section 120. In certain embodiments, receiver section 120 as shown is referred to as an analog front end (AFE) section of a receiver. For example, the receiver can be a serializer-deserializer (SerDes) receiver.

Transmitting entity 110 sends data signal, in analog form, to receiver section 120 via communication channels as shown. The incoming signal (from the perspective of receiver section 120) is first processed by the input termination block. Input termination block 121 keeps the input impedance of the receiver close to a predetermined value (e.g., about 50Ω in certain implementations) across a target frequency range (e.g., frequency range used in data transmission) to minimize the reflections. Additionally, input termination block 121 provides signal attenuation to handle a wide range of channels. For example, if the channel is clean and short (e.g., small signal attenuation attributed to channel loss), signal amplitude at the input termination block 121 could be undesirably high and compromise linearity of receiver section 120. By providing attenuation when needed, input termination block 121 helps maintain linearity of receiver section 120.

It is to be noted that the exemplary receiver section 120 also includes a continuous time linear equalizer (CTLE) block 123, a variable-gain amplifier (VGA) block 124, and an analog-to-digital converter (ADC) block 125. It is to be understood that receiver section 120 can be implemented in other ways as well, such as having different functional blocks with other arrangements.

For various applications involving data communication, it is desirable to adjust the gain attenuation. For example, gain attenuation of the termination block 121 is implemented with programmable gain attenuation (PGA) according to embodiments of the invention. More specifically, incoming signal received by the termination block 121 is usually not controlled, and the signal swing can vary from 200 mV to 1.2V in certain scenarios. For receiver section 120 to properly process incoming signals, the incoming signal needs to be adjusted to be within a predetermined range. For example, the attenuation of the incoming signal can be provided by both the termination block 121, CTLE block 123, and/or the VGA block 124. It is to be appreciated that for large swing of the incoming signal, VGA 124 would be difficult to implement using CMOS circuits. Among other things, large swing range of incoming signal is difficult to attenuate and can degrade linearity. Additionally, certain VGA implementations can lead to undesirable power consumption. Output of VGA 124 is coupled to an analog-to-digital converter (ADC) 125 as shown.

An important aspect of termination block 121 is to provide bandwidth input matching. As an example, for backplane communication links and related applications, poorly matched termination circuit can lead to signal reflection. For example, the amount of reflection is often expressed by parameter S11 (e.g., a parameter measuring input return loss). Signal reflection is an important concern in communication applications, as it often requires large portion of system budget to compensate. High bandwidth input matching can effectively optimize parameter S11 value and improve system performance. For example, if a signal passes through a low-loss channel, it typically has a relatively higher (compared to high-loss channel) frequency component. Well-implemented input matching can reduce reflection issue across a wide bandwidth, especially regarding the high-frequency components.

By improving the performance of termination block 121, the workload of CTLE block 123 is reduced. High-peaking CTLE is often hard to design, and CTLE often requires more power and device area. By shifting workload from CTLE to termination block 121, the system performance can be improved and the system cost can be reduced.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 2:
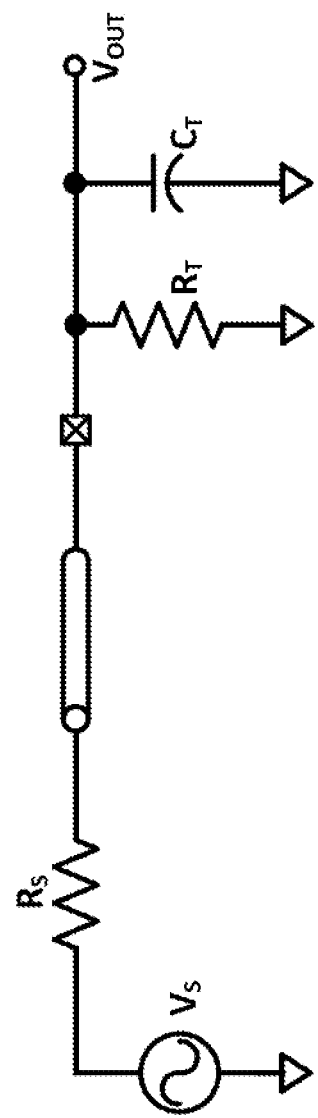
FIG. 2 is a simplified diagram illustrating impedance matching.

FIG. 2 is a simplified diagram illustrating impedance matching. For example, to match source impedance (e.g., $R_s$), a termination resistor $R_T$ is provided. For example, termination resistor $R_T$ can be implemented with a variable resistor whose resistance value is adjustable to match the source impedance. At the termination circuit, one of the considerations is the capacitance $C_{IN}$ as shown, which is frequency dependent and contributes to roll off in signal bandwidth and affects an S11 parameter. As frequency becomes high, capacitance $C_{IN}$ becomes a bigger factor affecting termination impedance and bandwidth. For example, a control module may generate control signals based on a lookup table, which includes presets of resistor values. In certain embodiments, control module is coupled to a feedback loop, and output signal strength is used as a part of the feedback loop to calculate optimal resistance values.

For example, for avoiding or minimizing reflection, termination resistance $R_T$ is configured to match the source resistance $R_S$, as expressed in Equation 1 below:

$$R_T = R_S \qquad \text{Equation 1:}$$

The signal bandwidth $BW_o$ of the system is expressed in Equation 2 below:

$$BW_o = \frac{1}{\frac{R_T}{2} C_{IN}} \qquad \text{Equation 2}$$

The cut-off frequency (f $c_{Zin}$) at which the return loss degrades and the parameter S11 starts to deteriorate is expressed in Equation 3 below:

$$fc_{Zin} = \frac{1}{R_T C_{IN}} \qquad \text{Equation 3}$$

According to the above equations, the parameter S11 starts to deteriorate at frequency f $c_{Zin}$, where the bandwidth also starts to roll off.

Figure 3:
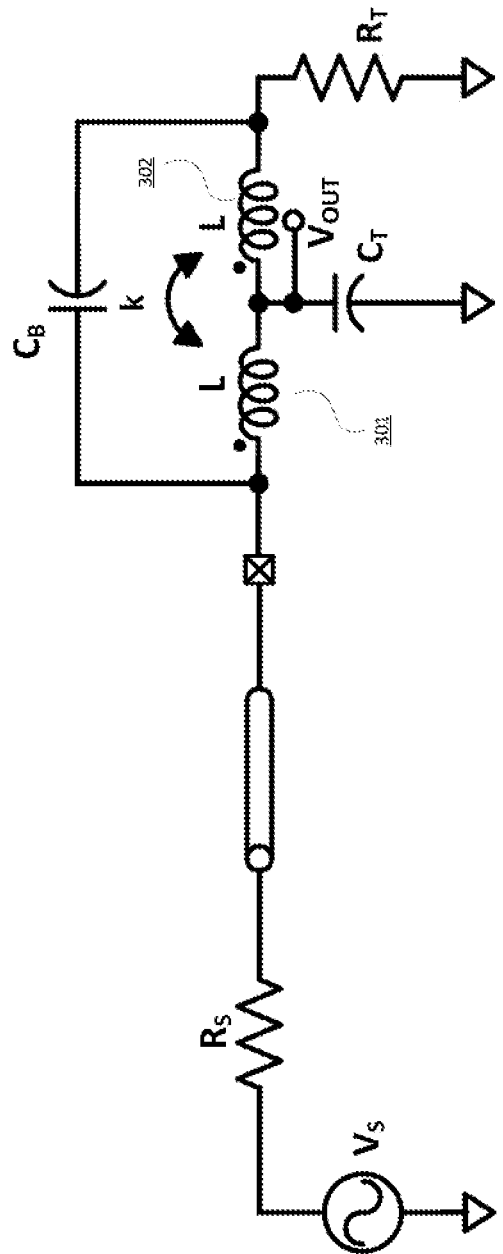
FIG. 3 is a simplified diagram illustrating a termination circuit with T-coils.

By introducing inductive elements in the termination circuit, signal bandwidth can be significantly improved. For example, inductive elements are provided by T-coils. FIG. 3 is a simplified diagram illustrating a termination circuit with T-coils. At the termination circuit, inductor 301 and inductor 302 are configured as shown, and together they extend bandwidth by a factor of $\sqrt{2}$. Presumably, the input impedance is purely resistive and equal to $R_s$. Theoretically, parameter S11 is ∞ for all the frequencies.

Figure 4:
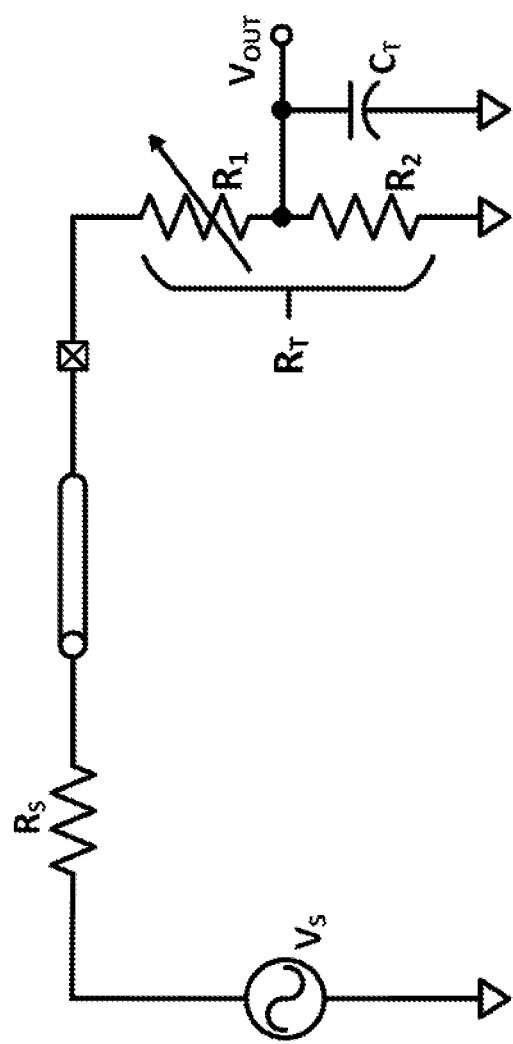
FIG. 4 is a simplified diagram illustrating a termination circuit with programmable gain attenuation.

FIG. 4 is a simplified diagram illustrating a termination circuit with programmable gain attenuation. Termination resistance $R_T$ is implemented with a voltage divider configuration with resistor $R_1$ and resistor $R_2$. Termination resistance $R_T$ is configured to match the source resistance $R_S$. For example, the magnitude of the output signal is a voltage divider arrangement provided by resistors $R_1$ and $R_2$. The attenuation factor $\alpha$ of the termination circuit is expressed in Equation 4 below:

$$\alpha = \frac{R_2}{R_1 + R_2} \qquad \text{Equation 4}$$

Figure 5:
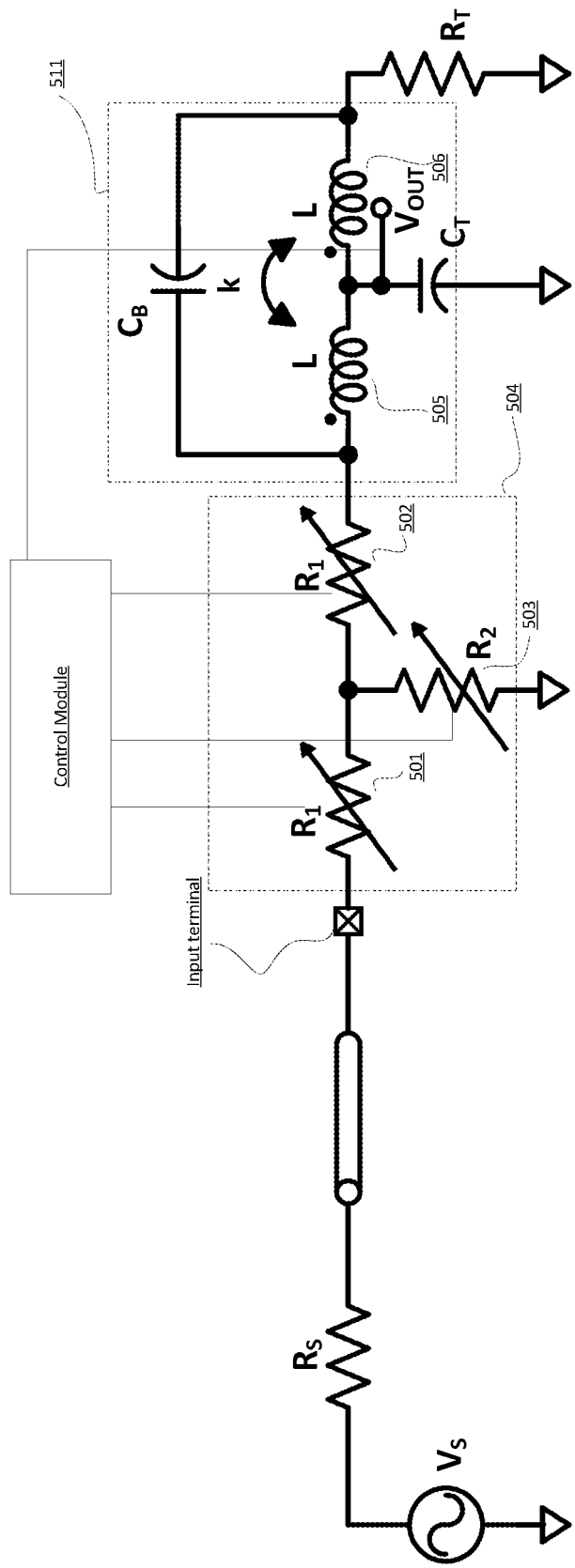
FIG. 5 is a simplified diagram illustrating a termination circuit according to an embodiment of the present invention.

FIG. 5 is a simplified diagram illustrating a termination circuit according to an embodiment of the present invention. This diagram is merely an example, which should not unduly limit the scope of the claims. One of ordinary skill in the art would recognize many variations, alternatives, and modifications. Section 504 provides the function of programmable gain attenuation. For example, resistors 501, 502, and 503 are variable resistors that can be adjusted to obtain the desired attenuation level. For example, the attenuation factor $\alpha$ of the PGA section 504 is described in Equation 4, which is based on the ratio of resistance values between resistor 501 and resistor 503. For example, resistors 501 and 502 are characterized by the resistance value $R_1$ while resistor 503 is characterized by the resistance value $R_2$.

In various embodiments, resistors 501, 502, and 503 receive control signals from a control module (not shown in FIG. 5), which generates controls signals based on the desired attenuation level. More specifically, control signals adjust the both resistance value ratio and the total resistance of the PGA section 504. For example, the control signals adjust the attenuation by changing the resistances $R_1$ and $R_2$, while maintaining the characteristic resistance of the attenuation network. For example, the characteristic resistance the PGA section 504 (which affects signal reflection) is maintained at resistance value $R_T$, while the ratio between resistors is adjusted to obtain the desired attenuation level. For example, characteristic resistance of the PGA section refers to the resistance value of the PGA section 504 as observed from node 510. In an embodiment, the control module generates control signals by dynamically adjusting the attenuation valuation using a feedback control loop. In certain embodiments, the control module generates control signals by using a lookup table. It is to be appreciated that control signals can be generated in many ways.

The inductors 505 and 506 (which are part of the T-coil section 511) are configured as shown to expand signal bandwidth of the receiver system. It is to be noted that the PGA section 504 provides attenuation adjustment without altering performance and function of T-coils section 511. For example, bridge capacitor $C_B$ is a part of the T-coil section that provides compensation for capacitance $C_{IN}$. Inductors 505 and 506 are mutually coupled, characterized by a coupling factor. The characteristic resistance of the PGA section 504 matches the resistance of termination resistor $R_T$ as shown. More specifically, the characteristic resistance of PGA section 504 is described in Equation 5 below:

$$R_1+(R_1+R_T)\|R_2=R_T \quad \text{Equation 5:}$$

Attenuation factor α is described in Equation 6 below:

$$\text{Attenuation } (\alpha) = \frac{R_2 \cdot R_T}{R_1^2 + 2R_1R_2 + R_T(R_1+R_2)} \quad \text{Equation 6}$$

The input impedance of the termination circuit is substantially resistive and equal to source resistance $R_S$. Theoretically, parameter S11 is ∞ for all the frequencies. It is to be appreciated by integrating the PGA section 504 with T-coil section 511 (which includes inductors 505 and 506 and bridge capacitor $C_B$) provides both expanded bandwidth and improved resistance matching, while at the same allows for adjustable attenuation.

Figure 6:
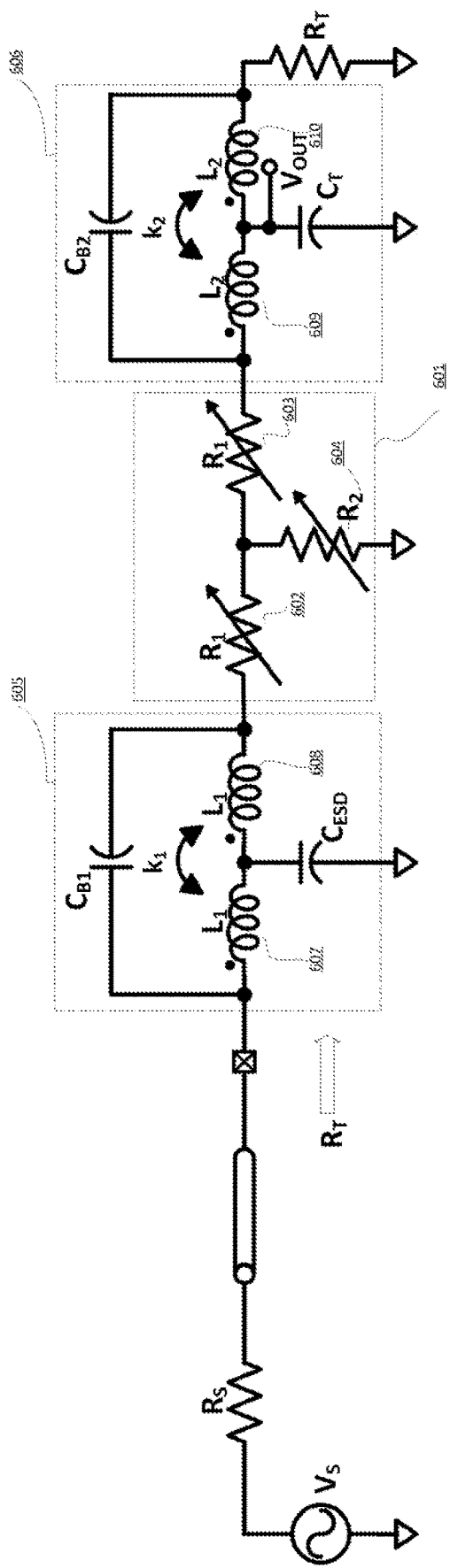
FIG. 6 is a simplified diagram illustrating a termination with T-coil sections and a PGA section according to embodiments of the present invention.

FIG. 6 is a simplified diagram illustrating a termination with T-coil sections and a PGA section according to embodiments of the present invention. This diagram is merely an example, which should not unduly limit the scope of the claims. One of ordinary skill in the art would recognize many variations, alternatives, and modifications. As shown, PGA section 601 is configured between T-coil section 605 and T-coil section 606. For example, the characteristic resistance of PGA section 601 matches the termination resistance of resistor $R_T$, as described in Equation 5 above. T-coil section 605 includes inductors 607 and 608 (mutually coupled inductors with a coupling factor of k1), and the bridge capacitor CB1(also a part of the T-coil section 605) provides compensation for capacitance $C_{ESD}$. For example, ESD capacitance $C_{ESD}$ refers to the capacitance attributed to components coupled to the input of the termination circuit. T-coil section 606 includes inductors 609 and 610 (mutually coupled inductors with a coupling factor of k2), and the bridge capacitor $C_{B2}$ (a part of the T-coil section 606) provides compensation for capacitance $C_{IN}$. In theory, parameter S11 is theoretically ∞ for all the frequencies. Additionally, PGA section 601 does not alter the performance or functionality of T-coil sections 605 and 606. For example, PGA section 601 provides attenuation adjustment by varying the resistance value of resistors 602, 603, and 604. For example, PGA section 601 is connected to a control module that provides control signals.

Figure 7:
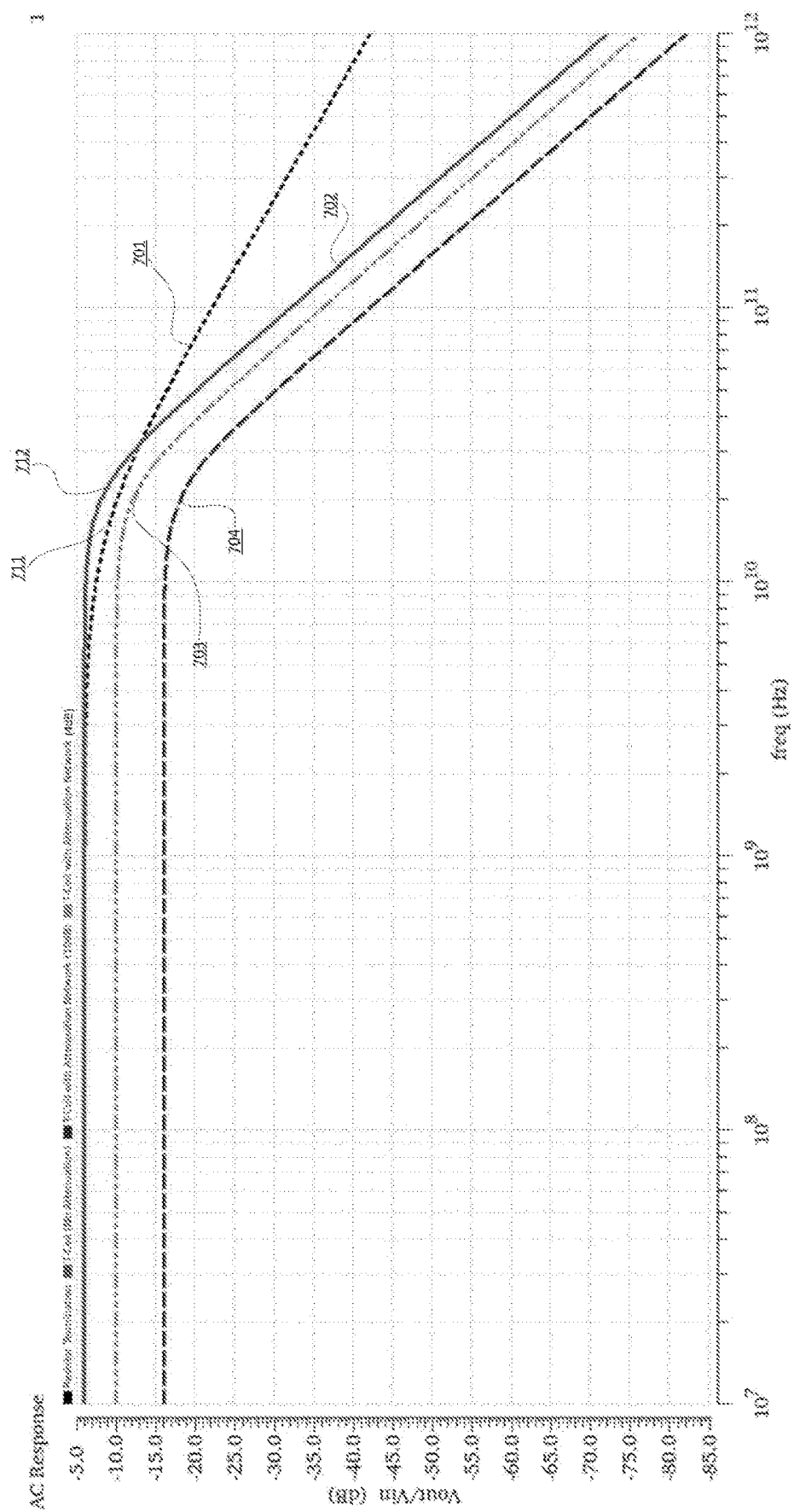
FIG. 7 is a diagram comparing frequency response of termination circuits.

FIG. 7 is a diagram comparing frequency response of termination circuits. Plot 701 illustrates the frequency response of a termination circuit with only resistors for attenuation. Plot 702 illustrates the frequency response of a termination circuit with T-coil circuit but no resistors for attenuation. Plot 703 illustrates the frequency response of a termination circuit with 4 dB attenuation network (e.g., provided by PGA according to embodiments of the present invention). Plot 704 illustrate the frequency response of a termination circuit with 10 dB attenuation network (e.g., provided by PGA according to embodiments of the present invention). Comparing plot 701 and plot 702, it can be seen that T coils extends signal bandwidth from point 711 to point 712. It is be noted that for both 10 dB and 4 dB attenuation levels (respectively shown in plots 704 and 703), signal bandwidths of the corresponding termination circuits remain substantially the same as plot 702.

Figure 8:
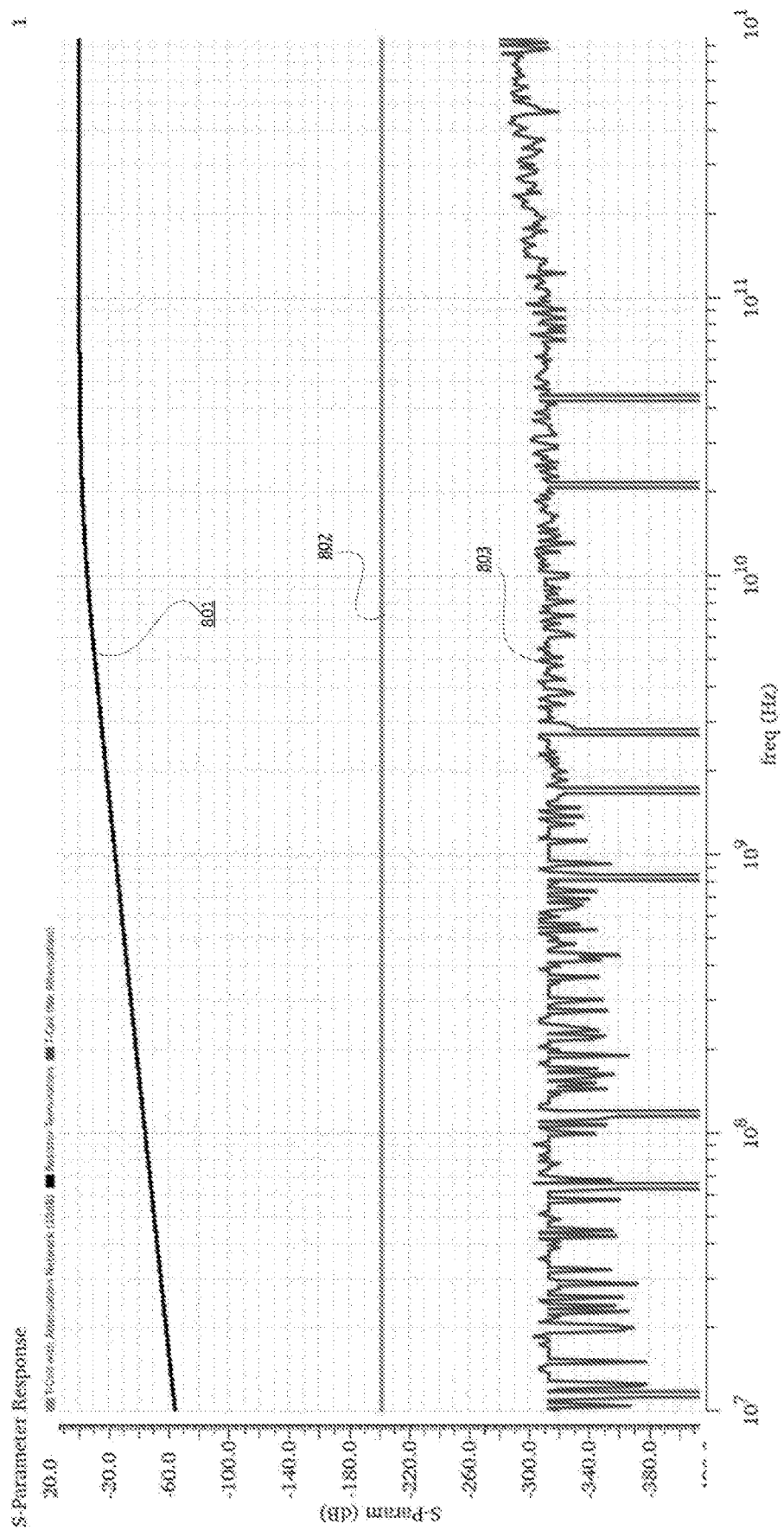
FIG. 8 provides simulated plots illustrating parameter S11 response for termination circuits according to embodiment the present invention.

FIG. 8 provides simulated plots illustrating parameter S11 response for termination circuits according to embodiment the present invention. Plot 801 illustrates parameter S11 response of termination circuit with resistor network. Limited by plot resolution, Plot 802 illustrates parameter S11 of a termination circuit with PGA and T-coils. Plot 803 (limited by resolution of simulation) illustrates parameter S11 of a termination circuit with T-coils but without attenuation. As illustrated in the plot, a PGA section implemented with T-coils does not alter the wideband input matching property of T-coils. It is to be appreciated that embodiments the present invention can be adopted into a wide range of applications. For example, termination circuits according the present invention can be used in various types of data communication applications. In a specific implementation, a termination circuit according to the present invention is used as a part of analog front end (AFE) of a serializer/deserializer (SerDes) device. Termination circuits according to the present invention can be used in conjunction with existing circuits, such as ADC, CTLE, VGA, CDR, LOSD, and/or others.

Figure 9A:
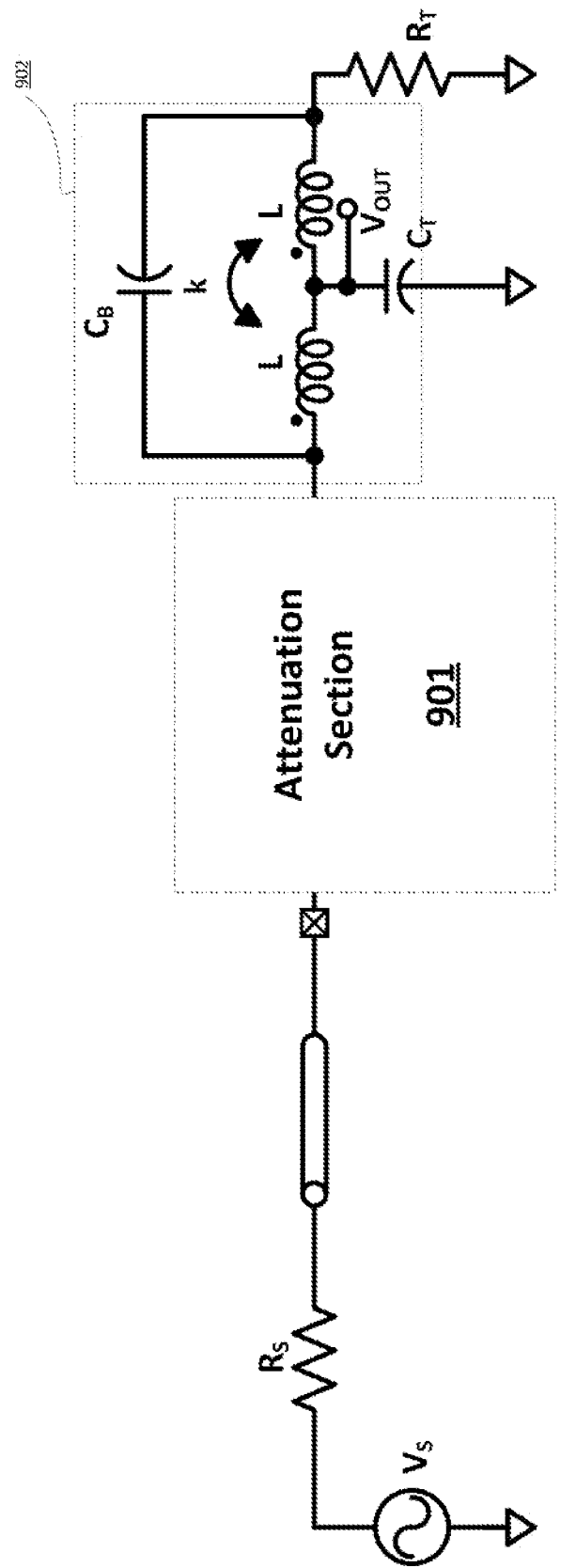
FIG. 9A is an exemplary termination circuits according to embodiments of the present invention.
Figure 9B:
FIG. 9B is a simplified diagram illustrating different types of attenuation configurations that can be incorporated into termination circuits according to embodiments of the present invention.
Figure 9B:
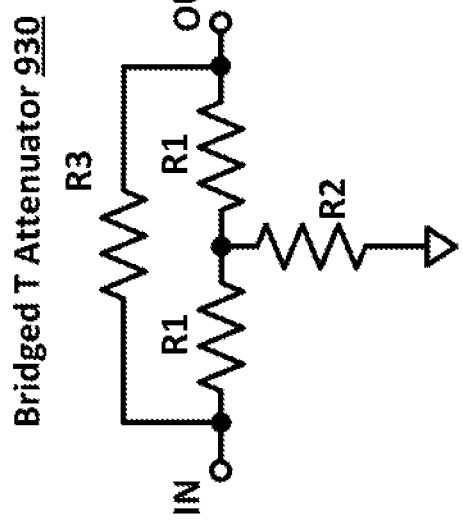

It is to be appreciated that embodiments of the present invention can be implemented in various ways. For example, the attenuation sections in FIG. 5 and FIG. 6 as shown are implemented with "T type" attenuator configuration, but other attenuation configurations can be used as well. FIG. 9A is an exemplary termination circuits with a generic attenuation section according to embodiments of the present invention. This diagram is merely an example, which should not unduly limit the scope of the claims. One of ordinary skill in the art would recognize many variations, alternatives, and modifications. The termination circuit in FIG. 9A includes an attenuation section 901 and a T-coil section 902. For example, attenuation section 901 can be implemented with attenuation configurations illustrated in FIG. 9B. FIG. 9B is a simplified diagram illustrating different types of attenuation configurations that can be incorporated into termination circuits according to embodiments of the present invention. As an example, attenuation configurations include T attenuator 910, 7C attenuator 920, and bridged T attenuator 930. For example, variable resistors are used to provide adjustable attenuation. For example, depending on the configuration, resistors are adjusted to provide the desired attenuation level and impedance matching.

Figure 9C:
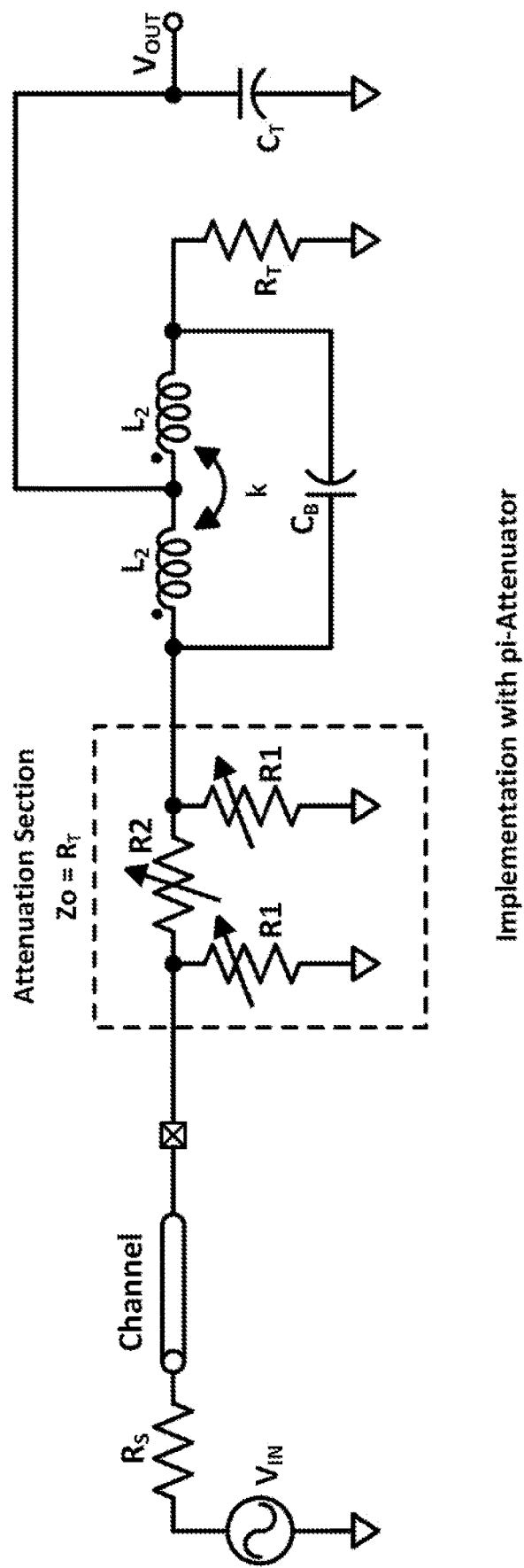
FIG. 9C is a simplified diagram illustrating a termination circuit with a 7C attenuator according to a specific embodiment of the present invention.

FIG. 9C is a simplified diagram illustrating a termination circuit with a 7C attenuator according to a specific embodiment of the present invention. This diagram is merely an example, which should not unduly limit the scope of the claims. One of ordinary skill in the art would recognize many variations, alternatives, and modifications.

Figure 10:
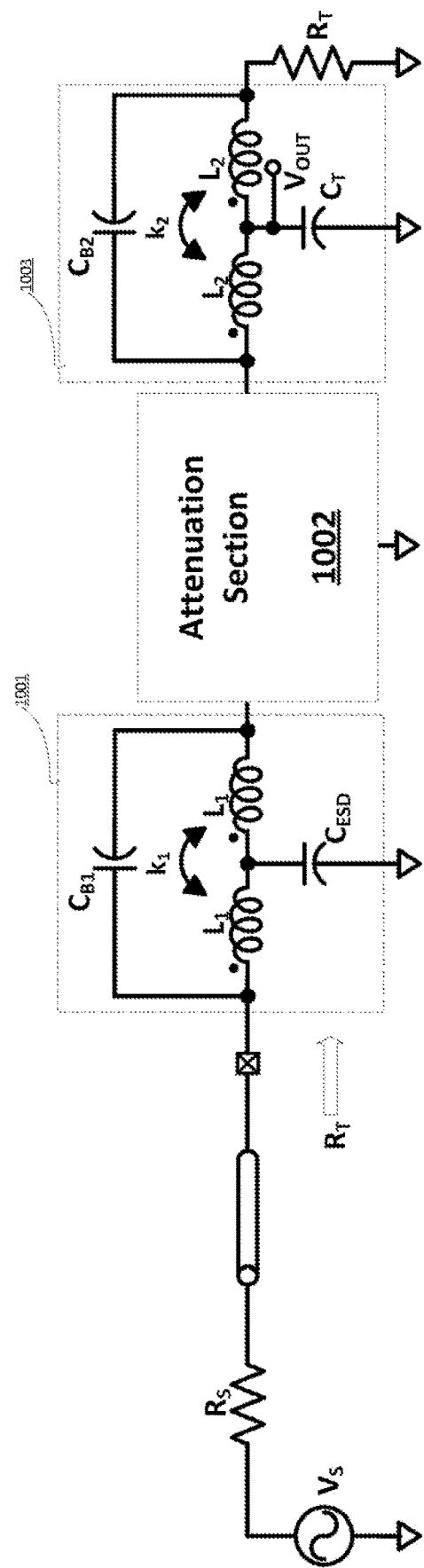
FIG. 10 is a simplified diagram illustrating an exemplary termination circuits with two T-coil sections according to embodiments of the present invention.

FIG. 10 is a simplified diagram illustrating an exemplary termination circuits with two T-coil sections according to embodiments of the present invention. This diagram is merely an example, which should not unduly limit the scope of the claims. One of ordinary skill in the art would recognize many variations, alternatives, and modifications. As an example, the termination circuit in FIG. 10 includes a T-coil section 1001, and attenuation section 1002, and a T-coil section 1003. Depending on the implementation, attenuation section 1002 can be implemented with attenuator configurations illustrated in FIG. 9B or other types of attenuators.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A termination circuit comprising:
an input terminal for receiving data signals;
a programmable gain attenuation (PGA) section coupled to the input terminal and comprising a first resistor, a second resistor, and a third resistor, the first resistor and the third resistor being directly coupled, the first resistor being directly coupled to the input terminal, the PGA section being characterized by a PGA characteristic resistance, the PGA characteristic resistance being adjustable, the first resistor and the third resistor characterized by a substantially same resistance value, the first resistor and the second resistor being variable resistors, the PGA section further being characterized by an attenuation factor;
a T-coil section comprising a first inductor and a second inductor, the T-coil section being coupled to the PGA section;
a termination resistor coupled to the T-coil section, the termination resistor being characterized by a termination resistance value, the PGA section being configured to adjust the PGA characteristic resistance to match the termination resistance value;
an output terminal coupled to the second inductor.

2. The circuit of claim 1 further comprising a control module for generating control signals to adjust the PGA characteristic resistance.

3. The circuit of claim 2 wherein the control signals are generated using a lookup table.

4. The circuit of claim 2 wherein the control signals are dynamically generated using a feedback loop.

5. The circuit of claim 1 wherein the second resistor is coupled to a ground.

6. A termination circuit comprising:
an input terminal for receiving data signals;
a first T-coil section coupled to the input terminal;
a programmable gain attenuation (PGA) section coupled to the first T-coil section and comprising a first resistor, a second resistor, and a third resistor, the first resistor and the third resistor being directly coupled, the PGA section being characterized by a PGA characteristic resistance, the first resistor being directly coupled to first T-coil section, the PGA characteristic resistance being adjustable, the first resistor comprising a variable resistor, the first resistor and the third resistor characterized by a substantially same resistance value, the second resistor being variable resistors, the PGA section further being characterized by an attenuation factor;
a second T-coil section comprising a first inductor and a second inductor, the second T-coil section being coupled to the PGA section;
a termination resistor coupled to the second T-coil section, the PGA characteristic resistance being adjustable to match to a termination resistance value of the termination resistor.

7. The circuit of claim 6 wherein the first T-coil section comprises a third inductor and a fourth inductor.

8. The circuit of claim 6 further comprising an output terminal coupled to the first inductor and the second inductor.

9. The circuit of claim 6 wherein the first T-coil section is configured to compensate a bump capacitance.

10. The circuit of claim 6 wherein the second T-coil section is configured to compensate an input capacitance.

11. A receiver device for comprising:
an input terminal for receiving data signal;
a termination circuit coupled to the input terminal;
a continuous time linear equalizer (CTLE) coupled to the termination section;
wherein the termination circuit comprises:
a programmable gain attenuation (PGA) section coupled to the input terminal and comprising a first resistor, a second resistor, and a third resistor, the first resistor comprising a variable resistor, the first resistor being directly coupled to the input terminal, the first resistor and the third resistor characterized by a substantially same resistance value, the first resistor and the second resistor being variable resistors, the PGA section being characterized by an attenuation factor;
a T-coil section comprising a first inductor and a second inductor, the T-coil section being coupled to the PGA section.

12. The device of claim 11 wherein the termination circuit further comprises an output terminal coupled to the first inductor and the second inductor.

13. The device of claim 11 wherein the first resistor and the third resistor are directly coupled, the PGA section being characterized by a PGA characteristic resistance, the PGA characteristic resistance being adjustable.

14. The device of claim 11 wherein the termination circuit further comprises a termination resistor coupled to the T-coil section, the PGA characteristic resistance being adjustable to match to a termination resistance value of the termination resistor.

15. The device of claim 11 wherein the first inductor and the second inductor are mutually coupled.

* * * * *